United States Patent [19]

Vu

[11] Patent Number: 4,709,345
[45] Date of Patent: Nov. 24, 1987

[54] APPARATUS FOR EXECUTING CHINESE REMAINDER THEOREM FOR RESIDUE DECODING THROUGH QUOTIENT-REMAINDER CONVERSION

[75] Inventor: Thu V. Vu, Indialantic, Fla.

[73] Assignee: Harris Corporation, Melbourne, Fla.

[21] Appl. No.: 719,915

[22] Filed: Apr. 4, 1985

[51] Int. Cl.⁴ ............................................... G06F 7/38
[52] U.S. Cl. .................................................. 364/746
[58] Field of Search ...................... 364/746; 235/311; 340/347 DD

[56] References Cited

U.S. PATENT DOCUMENTS 4,107,783  8/1978  Huang ................................. 364/746
4,281,391  7/1981  Huang ................................. 364/746
4,506,340  3/1985  Circello et al. ..................... 364/746

OTHER PUBLICATIONS

F. Barsi et al, "Error Correcting Properties of Redundant Residue Number System", IEEE Trans. on Comp. C-22, No. 3, 3/1973, pp. 307-315.
W. Jenkins et al, "The Use of Residue Number Systems in the Design of Finite Impulse Response Digital Filters", IEEE Trans on Cir & Syst., vol. CAS-24, No. 4, 4/1977, pp. 191-201.
W. Jenkins, "Techniques for Residue-to-Analog Conversion for Residue-Encoded Digital Filters", IEEE Trans. on Cir. & Syst., vol. CAS-25, No. 7, 7/1978, pp. 555-562.
A. Baraniecka et al, "On Decoding Techniques for Residue Number System Realizations of Digital Signal Processing Hardware", IEEE Trans on Cir. & Syst., vol. CAS-25, No. 11, 11/1978, pp. 935-936.
M. Soderstrand et al, "An Improved Residue System Digital-to-Analog Converter", IEEE Trans. on Cir. & System, vol. CAS-30, No. 12, Dec. 1983, pp. 903-907.
W. Jenkins, "A Technique for the Efficient Generation of Projections for Error Correcting Residue Codes", IEEE Trans. on Cir. & Syst., vol. CAS-31, No. 2, 2/1984, pp. 223-226.

F. Taylor, "Residue Arithmetic: A Tutorial with Examples", IEEE Computer, vol. 17, pp. 50-62, May 1984.
I. Ho et al, "Multiple Addition by Residue Threshold Functions and Their Representation by Array Logic", IEEE Trans. on Comp., vol. C-22, No. 8, 8/1983, pp. 762-767.
D. Fraser et al, "An Adaptive Digital Signal Processor Based on the Residue Number System", AIAA 2nd Comp. in Aerospace Conference, Los Angeles, CA, Oct. 22-24, 1979.
V. Cheng et al, "On the Decoding of Residue Numbers", Proc. Int. Symp. on Mini-Micro Computers in Control and Measurement, San Francisco, CA, May 20-22, 1981.
F. Taylor et al., "An Efficient Residue-to-Decimal Converter", IEEE Trans on Circuits and Systems, vol. CAS-28, No. 12, Dec. 1981, pp. 1164-1169.
C. Huang, "A Fully Parallel Mixed-Radix Conversion Algorithm for Residue Number Applications", IEEE Trans. on Comp. vol. C-32, No. 4, 4/1983, pp. 398-402.

(List continued on next page.)

Primary Examiner—Gary V. Harkcom
Assistant Examiner—Tan V. Mai
Attorney, Agent, or Firm—Antonelli, Terry & Wands

[57] ABSTRACT

A mechanism for implementing the Chinese remainder theorem includes a signal processing architecture that is effectively configured principally of binary adders and lookup tables having small address space. Through a set of lookup tables referencing a prescribed divisor, a respective set of summands are expressed in terms of quotients and remainders. Those signal lines over which the quotient representative data is produced are summed in a modulo-power-of two adder, while the remainder data is summed in a simple binary adder. The resulting sums are then recombined into a common data format, using a reduced capacity lookup table and binary adders.

13 Claims, 2 Drawing Figures

OTHER PUBLICATIONS

D. Atkins et al. *"Time-Component Complexity of Two Approaches to Multioperand Binary Addition"*, IEEE Trans on Comp., vol. C-28, No. 12, 12/1979, pp. 918-926.

T. Vu, *"The Use of Residue Arithmetic for Fault Detection in a Digital Flight Control System"*, Proc. Nat. Aerospace Electron. Conf., Dayton, OH, May 21-25, 1984.

W. Jenkins, *"Recent Advances in Residue Number Techniques for Recursive Digital Filtering"*, IEEE Trans. on Acoustics Speech & Signal Proc., vol. ASSP-27, No. 1, 2/1979, pp. 19-30.

T. Vu, *"Efficient Implementations of the Chinese Remainder Theorem for Sign Detection and Residue Decoding"*, IEEE Trans. on Comp. vol. C-34, No. 7, 7/1985, pp. 646-651.

NORMAL POSITION:
X

CIRCULAR SHIFT:
$V = \langle X + M/2 \rangle_M$

LINEAR SHIFT:
$W = V - M/2$ $-\frac{M}{2}$   0   $\frac{M}{2}$   M

APPARATUS FOR EXECUTING CHINESE REMAINDER THEOREM FOR RESIDUE DECODING THROUGH QUOTIENT-REMAINDER CONVERSION

FIELD OF THE INVENTION

The present invention relates in general to signal processing systems and is particularly directed to a mechanism for implementing the Chinese remainder theorem through the use of a quotient-remainder conversion/accumulation apparatus.

BACKGROUND OF THE INVENTION

Signal processing mechanisms such as those employed in fault-tolerant data processing systems have, for the most part, avoided the use of residue signal processing because of the complexity of difficult operations such as scaling, sign determination, magnitude comparison, overflow detection, etc., which require knowledge of the magnitude of residue numbers. For example, the sign of a residue number is determined by comparing the number with $M/2$, where M is the range of the number system. Magnitude information is also indispensable in a redundant residue number system because a possible first step toward correcting errors is to compare projections of a number with the ratio $M_T/M_R$, where $M_T$ is the total range and $M_R$ the redundant range. Since the magnitude is not explicitly available in the residue representation of a number, some form of conversion from residues to digits in a weighted number system is necessary. Currently known techniques for residue decoding are based either on the Chinese remainder theorem or on a mixed radix conversion. Although the Chinese remainder theorem provides a direct conversion formula which is simple and potentially fast, its implementation into high-speed digital signal processing systems has been hindered by the lack of adders modulo a large and arbitrary integer. On the contrary, conversion to mixed radix digits can be easily realized with lookup tables of modest size, but the process is notoriously slow due to the propagation of carries, a computational bottleneck characteristic of weighted number systems.

SUMMARY OF THE INVENTION

In accordance with the present invention, there is provided a substantially simplified mechanism for implementing the Chinese remainder theorem which overcomes both the lack of signal processing speed of mixed-radix conversion processing approaches, and previous constraints on realizing the Chinese remainder theorem in a practical hardware architecture. Pursuant to the invention, the Chinese remainder theorem can be successfully implemented using a signal processing architecture that is effectively configured principally of binary adders and lookup tables having small address space. To this end through a set of lookup tables referencing a prescribed divisor, a respective set of summands are expressed in terms of quotients and remainders. Those signal lines over which the quotient representative data is produced are summed in a modulo-power-of-two adder, while the remainder representative data is summed in a simple binary adder. The resulting sums are then recombined into a common data format, using a reduced capacity lookup table and binary adders. Carrying out an equivalent transformation of addition modulo a large and arbitrary integer into simple addition modulo a power of two, coupled with the use of fast signal processing techniques for multioperand binary addition, enables the inventive implementation of the Chinese remainder theorem to provide a faster alternative for conversion purposes than techniques that rely on mixed radix digits.

DETAILED DESCRIPTION

Figure 1:
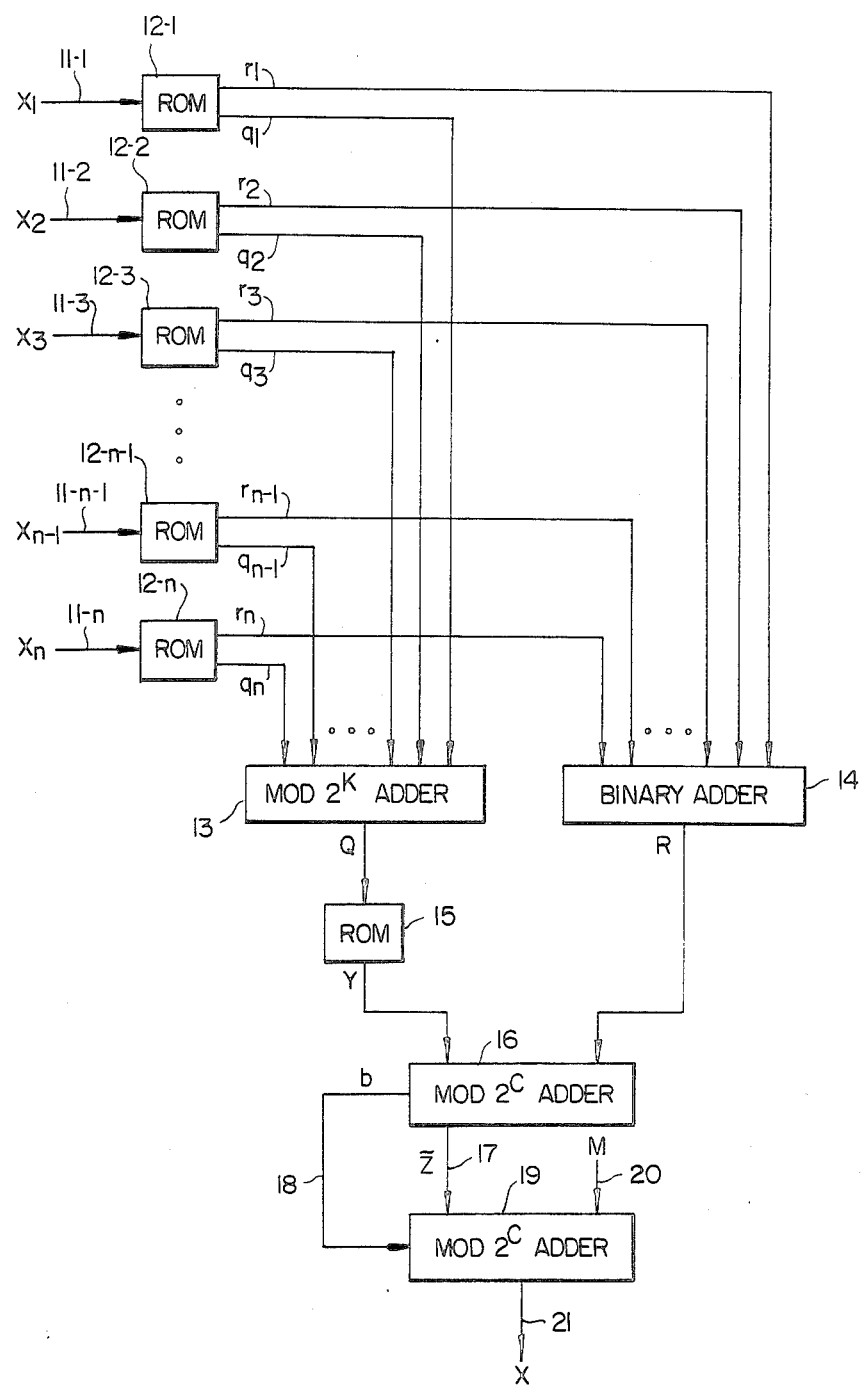
FIG. 1 is a digital schematic block diagram of a Chinese remainder theorem signal processing mechanism employing a quotient-remainder format accumulative architecture.

Before describing, in detail, the particular improved Chinese remainder theorem conversion scheme in accordance with the present invention, it should be observed that the present invention resides primarily in a novel structure combination of conventional digital signal processing logic circuits and not in the particular detailed configurations thereof. Accordingly, the structure, control and arrangement of such logic circuits have been illustrated in the drawings by readily understandable block representations and schematic diagram, which show only those specific details that are pertinent to the present invention, in order not to obscure the disclosure with structural details which will be readily apparent to those skilled in the art having the benefit of the description here. Thus, the block diagram illustration does not necessarily represent the mechanical structural arrangement of the exemplary system, but is primarily intended to illustrate the major structural components of the system in a convenient functional grouping, whereby the present invention can be more readily understood.

In order to facilitate a full appreciation of the manner in which the present invention achieves its substantially improved signal processing capability for residue signal processing, it is useful to review the Chinese remainder theorem and its general application to data/signal processing.

In accordance with the Chinese remainder theorem, an integer X is converted from its residue number representation by the weighted sum $$X = < \sum_{i=1}^{n} \frac{M}{m_i} < w_i x_i > m_i > M \quad (1)$$

where
  $m_i$'s are the system moduli,
  $M = m_1 m_2 \ldots m_n$ is the system range,
  $w_i$'s are constants such that $<(M/m_i)w_i>_{m_i} = 1$, and
  $x_i$ is the residue of X with respect to $m_i$.

As only integers in the range [O,M] are considered, the weighted sum is evaluated modulo M; that is, X is the nonnegative remainder obtained when the sum is divided by M.

The Chinese remainder theorem may be used as the basis for a fast and simple residue number decoder using a set of read only memories (ROMs) respectively coupled to a modulo M adder. Since $x_i$ is usually small, the values $$s_i = \frac{M}{m_i} <w_i x_i> m_i \qquad (2)$$

can be stored practically in a respective ROM (lookup table) as a function of $x_i$. For example, five-bit residues occupy only thirty-two locations with a word length equal to $\lceil \log_2 M \rceil$. However, the modulo M adder through which the outputs of the ROMs are summed causes a major implementation problem, because M is generally a very large and arbitrary integer. The common practice of substituting lookup tables for modular adders is obviously out of the question. On the other hand, a modular adder designed from a conventional binary adder would require additional logic to detect overflow and correct the overflowed sum. Such an adder must be custom designed and is more expensive to operate than an ordinary binary adder. Hence, some way for handling the sum modulo M must be found if an efficient residue number decoder based on the theorem is to be built.

Two approaches have been proposed by various authors to compute the sum modulo M in equation (1). In accordance with the first approach, overflow is detected and a correction is made as soon as a partial sum is formed. The total sum is obtained either sequentially by a modulo M accumulator or in parallel by a tree array of modulo M adders. Thus, the basic problem of mechanizing addition of two numbers modulo M is encountered here. As described in an article by F. J. Taylor entitled "Residue Arithmetic: A Tutorial with Examples", IEEE Computer, Vol. 17, pp. 50–62, May 1984, it may be assumed that $M = 2^a - 2^b$ (a,b being integers) because, for this particular value, one can implement the detection and correction steps with a simple programmable logic array. Nevertheless, compared with a binary adder, the proposed adder is still expensive, and the restriction imposed on M severely limits the selection of the system moduli, which must be relatively prime in pairs. In addition, by using only binary adders, as described in an article entitled "A Technique for the Efficient Generation of Projections for Error Correcting Residue Codes", IEEE Trans. Circuits and Systems, Vol. CAS-31, pp. 223–226, February 1984, W. K. Jenkins computed an ordinary sum but biased the sum so that the detection step became completely trivial. With the bias included, overflow in addition modulo M coincides with overflow in binary addition, which is indicated by the most significant carry bit, but the correction step may still be required in the form of another addition. As a result, when a sum of n operands is carried out, the additional delay is multiplied either by $n-1$ for sequential summation or by $\lceil \log_2 n \rceil$ for parallel summation.

In accordance with the second approach, the sum is allowed to grow without the interference of any intermediate detection and correction steps. Then the raw result is compared with a series of reference points, and a proper correction term is generated to be applied to the sum. Normally for a sum of n operands, all of which are less than M, $n-1$ reference points are required. As described in an article by D. F. Fraser and N. J. Bryg entitled "An Adaptive Digital Signal Processor Based on the Residue Number System", Proc. AIAA Second Computers in Aerospace Conf., L.A., Calif., Oct. 22–24, 1979, by shifting the sum and scrutinizing overflow bits from binary adders employed in accumulating the sum, Fraser and Bryg managed to cut the number of comparisons down to exactly one. Their technique worked correctly for the example given. Later, as described in an article by V. S. Cheng and C. H. Huang entitled "On the Decoding of Residue Numbers", Proc. Int. Symp. on Mini-Micro Computers in Control and Measurement, San Francisco, Calif., May 20–22, 1981, Cheng and Huang formalized the technique and revealed, however, that a certain inequality must be satisfied by M in order to keep the number of comparisons at one. It was found that as the number of moduli increases, M must approach a power of two, a restriction which also complicates the selection of $m_i$'s.

The new conversion technique according to the present invention takes into account both accomplishments and shortcomings of past implementations of the Chinese remainder theorem. First, it is ideal to have the bulk of the computation (i.e., the summation of n numbers) carried out by binary adders. Although intermediate correction steps are allowed, they must be in a very simple form such as dropping the most significant bits. This makes possible the use of standard binary hardware and fast techniques for multioperand binary addition to fully exploit the parallel conversion algorithm provided by the theorem. It is also desirable to complete any final correction step at a minimal cost using as much simple hardware as possible. Last and most importantly, there must be no severe restrictions on the definition of the system moduli.

It turns out that these objectives can be achieved by an appropriate representation of $s_i$'s other than the usual integer representation. Since the summands are intended to be fetched from lookup tables, representing them in a different form does not require any special real-time processing. The true requirements for a candidate number representation are that addition modulo M be transformed into the much desired addition modulo a power of two, and the adjustment of the final sum back to a standard form be easily carried out. As will be described in detail below, these objectives are attained through a hardware configuration that employs a quotient-remainder representative scheme.

From equation (2) above it will be recalled that the summands $s_i$'s are such that $0 \leq s_i < M$. Now, if a particular modulus $m_j$ is singled out to be used in expressing $s_i$ as $$s_i = q_i \frac{M}{m_j} + r_i, \qquad (3)$$

where $q_i$ and $r_i$ are, respectively, the quotient and remainder of $s_i$ with respect to $M/m_j$, such that $$0 \leq q_i < m_j, \; 0 \leq r_i < \frac{M}{m_j} \qquad (4)$$

then the conversion expression in the Chinease remainder theorem becomes $$X = <\sum_{i=1}^{n} s_i> M \qquad (5)$$

$$= <\sum_{i=1}^{n} \left( q_i \frac{M}{m_j} + r_i \right)> M \qquad (6)$$

$$= << \frac{M}{m_j} \sum_{i=1}^{n} q_i > M + <\sum_{i=1}^{n} r_i> M > M \qquad (7)$$

$$= < \frac{M}{m_j} < \sum_{i=1}^{n} q_i > m_j + < \sum_{i=1}^{n} r_i > M > M \quad (8)$$

This leads to an efficient procedure for computing X without adders modulo M as follows. Let $$Q = < \sum_{i=1}^{n} q_i > m_j \quad (9)$$

and $$R = < \sum_{i=1}^{n} r_i > M \quad (10)$$

Computing the sum in equation (9) is not a problem because the modulus $m_j$ is small; lookup tables are commonly used. However, Q is obtained most easily when $m_j = 2^k$ or $2^k - 1$, for some k, as these values correspond to k-bit binary addition with discarded carry or end-around carry. Since it is not unusual to have a power of two included in most practical systems of moduli, $m_j = 2^k$ is assumed from now on. The final sum in equation (9) will be a nonnegative integer strictly less than $2^k$, which in turn is multiplied by $M/2^k$ via a table lookup. As to the sum in equation (10), the following inequality, $$0 \leq \sum_{i=1}^{n} r_i < \frac{nM}{m_j} \leq M, \quad (11)$$

is true if $n \leq m_j = 2^k$. Again, this condition is easily satisfied by most practical residue number systems. For example, when $2^k$ is selected as the largest modulus, the number of relatively prime moduli which might be considered to complete the system is much less than $2^k$, even less than $2^{k-1}$. Thus, as a result of equation (11) the sum R is computed simply as an ordinary sum.

Finally, let $Z = Q(M/2^k) + R$. Then from equation (8), $X = <Z>_M$ or $$X = Z \text{ if } Z < M, \quad (12)$$

and $$X = Z - M \text{ if } Z \geq M.$$

The comparison of Z with M can be eliminated by adding in advance a shift (or bias) to Z. More specifically, let $c = \lceil \log_2 M \rceil$ and let the positive shift $2^c - M$ be included in the lookup table where Q gets multiplied by $M/2^k$. That is, let $Y = Q(M/2^k) + (2^c - M)$ be fetched from the table, given the input Q. Then when the shifted sum $\tilde{Z} = Y + R = Z + (2^c - M)$ is formed modulo $2^c$, a most significant carry bit b is also generated. If $Z \geq M$, this bit is 1 because $Z + (2^c - M) \geq 2^c$; it is 0, otherwise. Thus, based simply on the bit value of b, the correction by M and the reverse shift are applied accordingly to yield $X = Z = \tilde{Z} - (2^c - M)$, or $X = Z - M = \tilde{Z}$.

Referring now to FIG. 1, there is shown a schematic block diagram of a digital hardware configuration for implementing the above-described quotient-remainder conversion scheme for the Chinese remainder theorem. As shown therein, a set of (digital) signals representative of residues $x_1, x_2, x_3, \ldots, x_{n-1}, x_n$ is coupled over input links 11-1 ... 11-n to a set of lookup tables or ROMs 12-1 ... 12-n. Each respective ROM 12-i produces two outputs: a quotient $q_i$ and a remainder $r_i$ of $s_i(x_i)$ with respect to a prescribed divisor $M/2^k$, as explained above in conjunction with equations (2) and (3). These outputs are coupled in sets over links $q_1 \ldots q_n$ and $r_1 \ldots r_n$, respectively to a pair of adders 13 and 14. Adder 13 is a modulo $2^k$ adder for summing all the quotient data values on lines $q_1 \ldots q_n$, while adder 14 is a binary adder for summing all the remainder data values on lines $r_1 \ldots r_n$. Thus, at the output of adder 13 there is obtained the quotient sum:

$$Q = \left( \sum_{i=1}^{n} q_i \right) \mod 2^k, \text{ where } k \text{ is an integer} \quad (13)$$

and at the output of adder 14 there is obtained the remainder sum:

$$R = \sum_{i=1}^{n} r_i \quad (14)$$

In order to combine the two sums Q and R and obtain an output value X whose residues are the inputs $x_1 \ldots x_n$, a translation or conversion is necessary. For this purpose, the output Q from modulo $2^k$ adder 13 is applied as the input to a lookup table or ROM 15 to produce a binary output Y. The binary output Y of ROM 15 is defined as:

$$Y = Q \frac{M}{2^k} + (2^c - M) \quad (15)$$

The binary values Y and R are summed together in modulo $2^c$ adder 16 to produce a binary sum $\tilde{Z}$ on output link 17 defined as:

$$\tilde{Z} = (Y + R) \mod 2^c \quad (16)$$

with the most significant carry bit b being coupled over carry line 18. Output link 17 and carry line 18 are coupled to a further modulo $2^c$ adder 19. The binary sum $\tilde{Z}$ on link 17 is summed in adder 19 with the constant value M coupled over link 20. The output X of adder 19 is defined as:

$$X = (\tilde{Z} + M) \mod 2^c \text{ if } b = 0, \text{ and} \quad (17)$$

$$X = \tilde{Z} \text{ if } b = 1 \quad (18)$$

It can be seen that representing $q_i$ and $r_i$ requires the same number of bits as representing $s_i$, but in $(q_i, r_i)$ format, the summands can be rapidly accumulated by binary adders. Also, column-compression or carry-save summing techniques may be employed for fast conversion time. As the word length of the sum Q is much shorter than that of the sum R (k versus $\lceil \log_2 nM \rceil - k$), the output Y of ROM 15 may be obtained even before the sum R is generated by adder 14.

Figure 2:
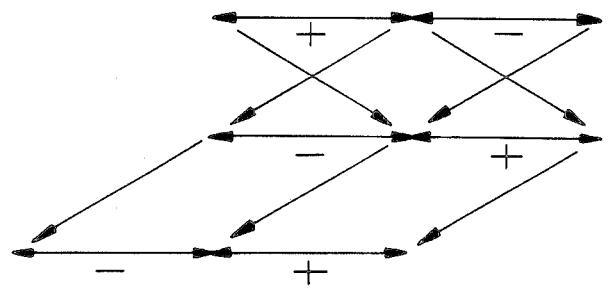
FIG. 2 is a diagram showing the shifts employed in conversion to signed integers.
Figure 2:

The integer X at the output of modulo $2^c$ adder 19 can be returned in two's complement binary form by a very simple modification to the decoder. The signed value is $W = X$ if $X < M/2$ or $W = X - M$ if $X \geq M/2$. Instead of the usual comparison and subtraction step following a conversion cycle, a simpler alternative is as follows. Let $V = <X + M/2>_M$. This creates the effect illustrated in FIG. 2 of a circular shift which pushes negative values into the lower half of the range [0,M), and positive values into the upper half. Then W is simply $V - M/2$ because the shift, linear this time, sends values back to their correct position in the interval $[-M/2, M/2)$. Thus, no comparison is necessary.

The circular shift is accomplished by changing the contents of lookup tables or ROMs 12-1 ... 12-n so that $M/2$ is added modulo $m_i$ to each residue $x_i$. Note that when $m_j = 2^k$ as assumed, this amounts to adding a zero for moduli with $i \neq j$. As a result, only one lookup table needs to be changed: the one which returns $q_j$ ($r_j$ is already zero). The linear shift is easily included in adder 19 as $$W = \left(\tilde{Z} + \frac{M}{2}\right) \bmod 2^c \text{ if } b = 0, \text{ and} \quad (19)$$

$$W = \left(\tilde{Z} - \frac{M}{2}\right) \bmod 2^c \text{ if } b = 1. \quad (20)$$

As will be appreciated from the foregoing description, the present invention provides a highly efficient architecture for realizing the Chinese remainder theorem. By reformulating the conversion expression given in the theorem, the inventive scheme makes it possible to evaluate the sum modulo M easily with binary adders and lookup tables. As the obstacle posed by adders modulo a very large and arbitrary integer no longer exists, the present invention offers a faster alternative to the traditionally slow mixed radix conversion method. Difficult operations such as conversion from residue numbers to unsigned or signed binary numbers readily benefit from the invention.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. An apparatus for processing data representative signals in accordance with the Chinese remainder theorem, including an arrangement for converting a plurality of n residue representative signals $x_1, x_2, \ldots, x_n$ to an output signal X, said an arrangement comprising:

first means, coupled to receive said plurality of n residue representative signals $x_1, x_2, \ldots, x_n$, for producing therefrom a first plurality of signals $q_1, q_2, \ldots, q_n$ respectively representative of quotients of prescribed functions of said residue representative signals with respect to a prescribed divisor and a second plurality of signals $r_1, r_2, \ldots, r_n$ respectively representative of remainders of said prescribed functions of said residue representative signals with respect to said prescribed divisor;

second means, coupled to said first means, for producing a quotient sum signal Q representative of the sum of said first plurality of signals in accordance with a prescribed signal format and for producing a remainder sum signal R representative of the sum of said second plurality of signals in accordance with said prescribed signal format; and third means, coupled to said second means, for combining said quotient sum signal Q and said remainder sum signal R to produce said output signal X.

2. An arrangement according to claim 1, wherein said prescribed divisor corresponds to $M/2^k$, where M is the product of the system moduli, and $2^k$ is a modulus greater than or equal to n and k is an integer.

3. An arrangement according to claim 1, wherein said second means comprises first adder means for summing said first plurality of signals $q_1, q_2, \ldots, q_n$ modulo $2^k$ and second adder means for obtaining the binary sum of said second plurality of signals $r_1, r_2, \ldots, r_n$.

4. An arrangement according to claim 3, wherein said third means comprises conversion means, coupled to the output of said first adder means, for deriving an output signal Y defined as $Y = Q(M/2^k) + (2^c - M)$, wherein $2^c$ is the smallest power of two greater than M; and third adder means, coupled to the output of said conversion means and said second adder means, for summing, module $2^c$, said signal Y and the remainder sum representative signal R obtained from said second adder means, to derive said output signal X.

5. An arrangement according to claim 4, wherein said third adder means comprises a first modulo $2^c$ adder, coupled to the outputs of said conversion means and said second adder means, for generating a first modulo $2^c$ summation signal $\tilde{Z} = (Y + R)$ modulo $2^c$ and a second modulo $2^c$ adder, coupled to receive said first modulo $2^c$ summation signal $\tilde{Z}$, an M representative signal and the most significant carry bit b produced by said first modulo $2^c$ adder, for deriving said output signal X as an unsigned binary signal $X = (\tilde{Z} + M) \bmod 2^c$ for $b = 0$, and $X = \tilde{Z}$ for $b = 1$.

6. An arrangement according to claim 4, wherein said conversion means comprises a read only memory in which are stored a plurality of Y signals, said quotient sum representative signal Q being applied as an address signal for accessing the contents of said read only memory.

7. An arrangement according to claim 1, wherein said first means comprises a plurality of read only memories in each of which are stored respective ones of said first and second pluralities of quotient and remainder representative signals, said residue representative signals being applied as address signals for accessing the contents of said read only memories.

8. An arrangement according to claim 7, wherein said prescribed divisor corresponds to $M/2^k$, where M is the product of the system moduli, and $2^k$ is a modulus greater than or equal to n and k is an integer.

9. An arrangement according to claim 1, wherein said first means includes means for adding $M/2$ modulo $m_i$ to each residue representative signal $x_i$, in the course of deriving a respective quotient signal $q_i$ and a respective remainder signal $r_i$ therefore.

10. An arrangement according to claim 9, wherein said prescribed divisor corresponds to $M/2^k$, where M is the product of the system moduli, and $2^k$ is a modulus greater than or equal to n and k is an integer.

11. An arrangement according to claim 10, wherein said second means comprises first adder means for summing said first plurality of signals $q_1, q_2, \ldots, q_n$ modulo $2^k$ and second adder means for obtaining the binary sum of said second plurality of signals $r_1, r_2, \ldots, r_n$.

12. An arrangement according to claim 11, wherein said third means comprises conversion means, coupled to the output of said first adder means, for deriving an output signal Y defined as $Y = Q(M/2^k) + (2^c - M)$, wherein $2^c$ is the smallest power of two greater than M; and third adder means, coupled to the output of said conversion means and said second adder for summing modulo $2^c$ said signal Y and the remainder sum representative signal R obtained from said second adder means, to derive said output signal X.

13. An arrangement according to claim 12, wherein said third adder means comprises a first modulo $2^c$ adder, coupled to the outputs of said conversion means and said second adder means, for generating a first modulo $2^c$ summation signal $\tilde{Z} = (Y+R)$ modulo $2^c$, and a second modulo $2^c$ adder, coupled to receive said first modulo $2^c$ summation signal $\tilde{Z}$, an M representative signal and the most significant carry bit b produced by said first modulo $2^c$ adder, for deriving said output signal X as a two's-complement binary signal $W = (\tilde{Z} + M/2)$ modulo $2^c$, for $b=0$, and $W = (\tilde{Z} - M/2)$ modulo $2^c$, for $b=1$.

* * * * *